(12) United States Patent
Cheah

(10) Patent No.: US 6,894,229 B1
(45) Date of Patent: May 17, 2005

(54) MECHANICALLY ENHANCED PACKAGE AND METHOD OF MAKING SAME

(75) Inventor: Eng C. Cheah, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/289,790

(22) Filed: Nov. 6, 2002

(51) Int. Cl.[7] .............................................. H05K 1/03
(52) U.S. Cl. ...................... 174/255; 174/260; 257/787; 257/796; 438/127; 29/841
(58) Field of Search ................................ 257/787–796; 438/112, 127; 174/260, 255; 29/841

(56) References Cited

U.S. PATENT DOCUMENTS

| 6,046,077 A | * | 4/2000 | Baba ........................ 438/127 |
| 6,191,360 B1 | * | 2/2001 | Tao et al. .................. 174/52.4 |
| 6,246,015 B1 | * | 6/2001 | Kim .......................... 174/261 |
| 6,433,420 B1 | * | 8/2002 | Yang et al. ................ 257/712 |
| 6,570,259 B2 | * | 5/2003 | Alcoe et al. .............. 257/778 |
| 6,654,248 B1 | * | 11/2003 | Fishley et al. ............. 361/704 |

* cited by examiner

Primary Examiner—Kamand Cuneo
Assistant Examiner—Jeremy Norris
(74) Attorney, Agent, or Firm—Morgan, Lewis & Bockius LLP

(57) ABSTRACT

An electronic package comprises a substrate, an electronic device mounted on the substrate, and a stiffener having a central hole on top of the electronic device. The electronic device has bond pads connected to the respective bond fingers on the substrate by bond wires. The stiffener and the substrate together define a space that houses the chip and the bond wires. A molding compound fills the space and covers the stiffener. A method of forming the electronic package comprises: providing the substrate; bonding the electronic device to the substrate; placing a stiffener on the substrate so that the stiffener and the substrate define a space for housing the electronic device; and injecting a molding compound into a central hole of the stiffener, the molding compound filling the space and overflowing out of the hole to cover the stiffener.

17 Claims, 3 Drawing Sheets

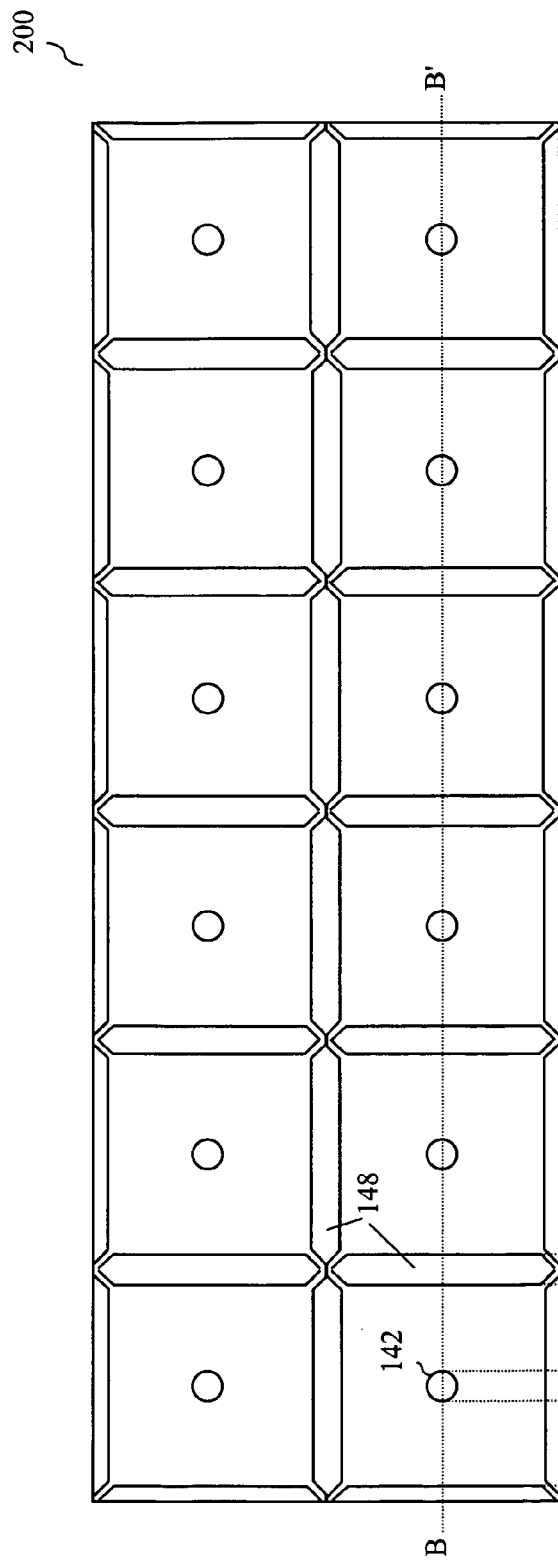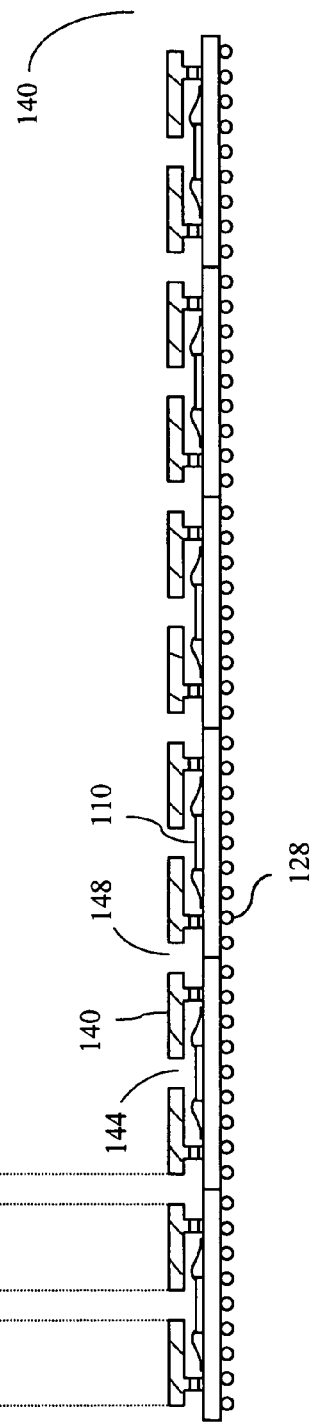
FIGURE 2A
FIGURE 2B

MECHANICALLY ENHANCED PACKAGE AND METHOD OF MAKING SAME

The present application relates to semiconductor packaging technologies.

BACKGROUND OF THE INVENTION

Microelectronic devices contain many electronic components, such as transistors, capacitors, resistors, etc., within a silicon chip. To form a usable device, a silicon chip requires protection from the environment as well as electrical and mechanical connections to other components. Electronic packaging deals with these requirements. An electronic package containing a silicon chip should provide access to the terminals or bond pads on the silicon chip for input power and signal transmission. The package may also provide the electrical wiring for interconnection among the electronic components on the chip. In addition, the electronic package should protect the circuits on the chip from damage during the chip's service life, and allow heat generated by the operation of the circuits to dissipate.

A typical electronic device package comprises various conducting and insulating materials that have different coefficients of thermal expansions (CTE). For example, an ball grid array (BGA) package may be constructed by attaching a chip to the topside of a substrate with epoxy glue. Bond wires provide connections between the bond pads on the chip pads and bond fingers on the substrate. The chip and the bond wires are embedded within a molding compound, such as a molding epoxy, on the topside of the substrate. Due to the different CTE's of the different materials used for assembling the package, the package may warp seriously during subsequent thermal processes such as a package board mounting reflow process. The warping is more prominent for lead (Pb) free packages because the reflow temperature for Pb free solder is as high as 240° C. to 260° C. The warping of the package may cause problems in solder joints between the package and the board, and consequently the reliability of the device.

SUMMARY OF THE INVENTION

The present invention overcomes the aforementioned disadvantages by providing an electronic package comprising a substrate, an electronic device mounted on the substrate, and a stiffener on top of the electronic device, wherein the stiffener has a hole at or near its center. The electronic device has bond pads connected to respective bond fingers on the substrate by bond wires. The stiffener and the substrate together define a space that houses the chip and the bond wires. A molding compound fills the space and covers the stiffener. In one embodiment of the present invention, a method for assembling the electronic package comprises the steps of bonding an electronic device to a substrate, and placing a stiffener on the substrate so that the stiffener and the substrate define a space for housing the electronic device. The stiffener has a hole at or near its center and a molding compound is injected into the hole of the stiffener. The molding compound fills the space and overflows out of the hole to cover the stiffener.

BRIEF DESCRIPTION OF THE DRAWINGS

Additional objects and features of the invention will be more readily apparent from the following detailed description and appended claims when taken in conjunction with the drawings, in which:

FIGS. 2A and 2B are block diagrams showing respectively a top view and a cross section of a portion of a strip of mechanically enhanced packages during a packaging process according to one embodiment of the present invention;

DESCRIPTION OF THE INVENTION

Figure 1A:
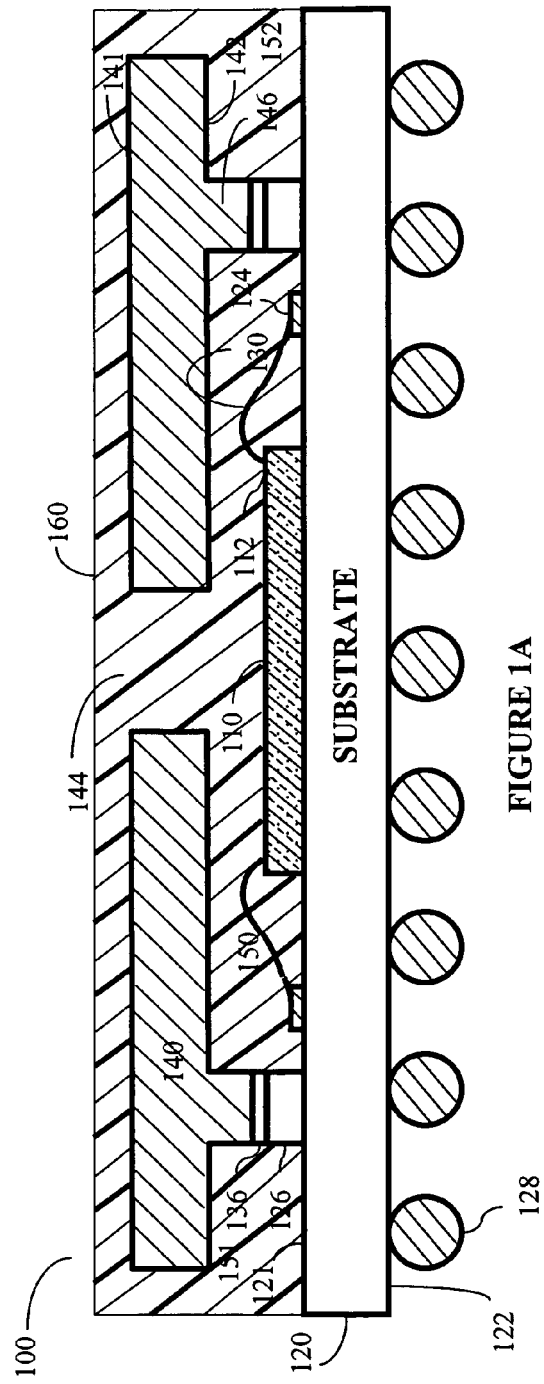
FIG. 1A is a block diagram showing a cross section of a mechanically enhanced package according to one embodiment of the present invention.
Figure 1B:
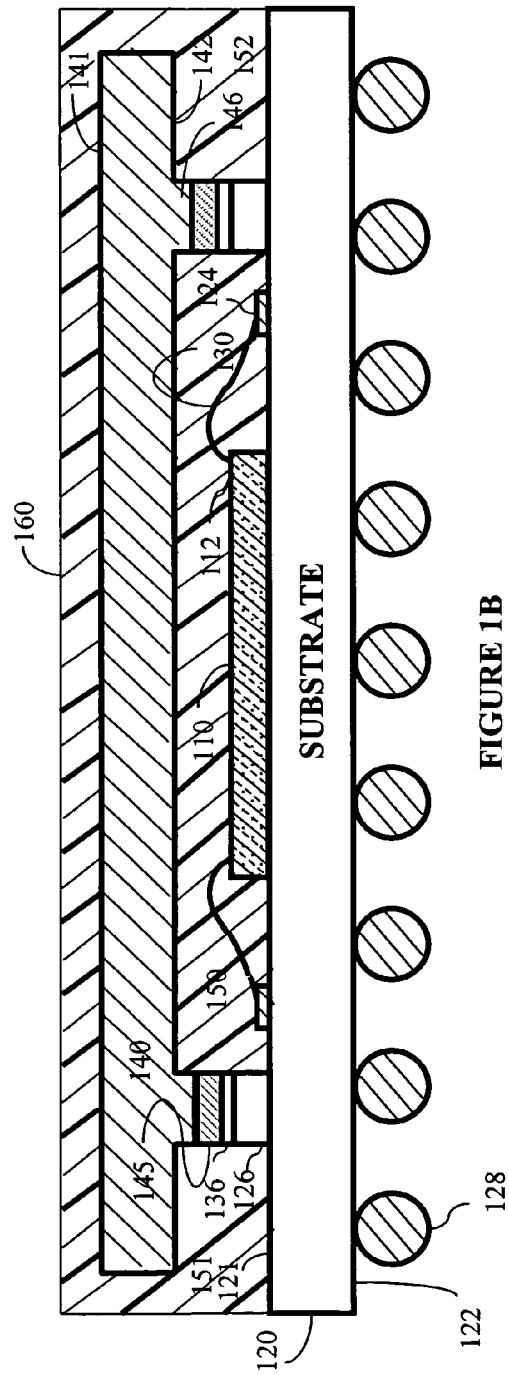
FIG. 1B is a block diagram of another cross section of the mechanically enhanced package according to one embodiment of the present invention.

FIG. 1A shows a vertical cross-sectional view taken through a center of a mechanically enhanced package (package) 100 according to one embodiment of the present invention. FIG. 1B shows another vertical cross-sectional view taken not through the center of the package 100. The Package 100 comprises a semiconductor chip 110, a substrate 120 and a stiffener 140. The chip 110 has microfabricated electronic circuits (not shown) and a plurality of bond pads 112 connected to the electronic circuits. The substrate has a topside 121, an underside 122, a plurality of bond fingers 124 on the top side 121, and an array of solder balls 128 on the underside 122. The solder balls 128 are connected to the respective bond fingers 124 through conductive lines and vias (not shown) built in the substrate 120. The package 100 further comprises bond wires 130 connecting the bond pad 112 on the chip with respective bond fingers 124 on the substrate. In one embodiment, the chip is bonded to the topside 121 of the substrate 120 by epoxy glue.

The substrate 120 also includes support pins 126 for supporting the stiffener 140. The stiffener 140 is in the shape of a plate having a topside 141, an underside 142, and a hole 144 at or near a center of the stiffener 140. The underside of the stiffener has ridges 146, and when the stiffener is placed on the substrate 120, the ridges 146 are above the support pins 126 on the substrate. The ridges 146 can be attached to the support pins 126 by an adhesive material 136, such as epoxy glue. The stiffener 140 and the substrate 120 thus form a void 150 or space for housing the chip 110 and the bond wires 130. Other spaces, such as spaces 151 and 152 may also be formed between the stiffener 140 and the substrate 120. A molding compound 160 fills the void 150 and spaces 151 and 152, and encapsulates the chip 110, the bond fingers 124, the bond wires 130, and the stiffener 140. As shown in FIG. 1B, the ridges 146 may be uneven so that vent holes 145 may exist between the stiffener 140 and the substrate 120 to allow the molding compound 160 to flow into void 150 through the center hole 144 and fill up the void 150 and spaces 151 and 152, as explained in more detail below.

The stiffener 140 may comprise metal or any other solid material that is mechanically robust enough and that has a relatively high thermal conductivity. The mechanical robustness is to keep the substrate 120 from warping during subsequent thermal processes. An advantage of using a relatively high thermal conductivity material for the stiffener 140 is that the stiffener will provide a thermal dissipation path as well as mechanical robustness for the package 100. In one embodiment of the present invention, the stiffener 140 includes metal, such as copper, as a core material.

The size of the stiffener 140 is about the same as or slightly smaller or bigger than the size of the substrate. Depending on the material used for the stiffener, the stiffener should be sufficiently thick to be mechanically robust. But the stiffener should not be too thick as to make the package too bulky for practical usage. In one embodiment of the present invention, the stiffener is made of copper and the thickness of the stiffener is about 0.5–2 mm. Also, the size of the hole 144 should be big enough to allow easy injection of the molding compound into the space 150, but it should not be too big to significantly reduce the strength of the stiffener for counteracting the warping force of the substrate 120. In one embodiment of the present invention, the size of the hole 120 is about 1–2 mm. Furthermore, there should be enough molding compound 160 covering the stiffener so that the stiffener is not likely to be delaminated from the molding compound during a thermal process when the package attempts to warp. In one embodiment of the present invention, the thickness of the molding compound 160 covering the stiffener is greater than 0.1 mm.

Although package 100 has been described using the package configuration shown in FIGS. 5A and 5B, it should be understood that the present invention applies to other package configurations as well. As examples, the type of packages that can make use of the present invention include BGA packages, PBGA (Plastic Ball Grid Array) packages, FBGA (Fine-line Ball Grid Array) packages, UFBGA (Ultra Fine-line Ball Grid Array) Packages, or the like.

For faster processing and ease of handling, package 100 can be made in a packaging process together with other similarly configured packages arranged in an array. FIG. 2A is a block diagram of a top view of an array 200 of packages. FIG. 2B shows the array 200 in vertical cross-section along line B–B'. The stiffeners for the array of packages are connected as one piece of material with gaps 148 for easy separation of the packages after the packaging process.

Figure 3:
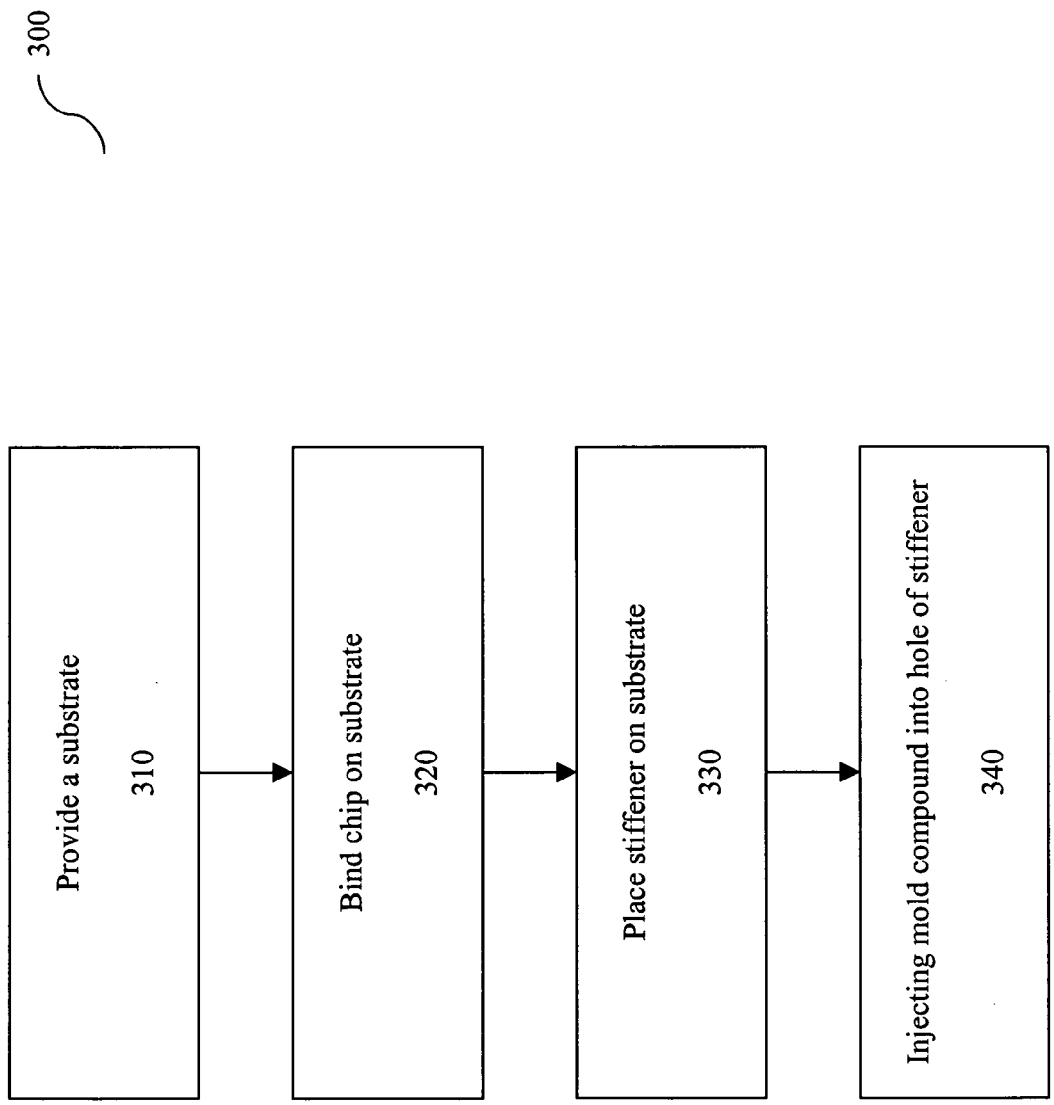
FIG. 3 is a flow chart illustrating a process of making the mechanically enhanced package according to one embodiment of the present invention.

FIG. 3 illustrates a process 300 for assembling the package 100 according to one embodiment of the present invention. Referring now to FIG. 3, the process 300 starts by providing at step 310 a substrate 120. Next, the chip is bonded at step 320 to the substrate. Step 320 may include sub-steps such as attaching the chip on the topside of the substrate with an adhesive material and connecting bond pads on the chip to respective bond fingers on the substrate with bond wires, etc. Then the stiffener 140 is attached at step 330 to the substrate by, for example, epoxy glue 136 that keeps the ridges 146 of the stiffener attached to the pins 126 of the substrate. When the package 100 is assembled together with similarly configured packages arranged in the array 200, the substrate 120 may be one of an array of substrates and the stiffener may be one of an array of stiffeners as shown in FIG. 2. In one embodiment of the present invention, the array of substrates has guide pins (not shown) and the array of stiffeners has guide holes (not shown) to match the guide pins. When they are so matched, the ridges 146 on the underside of the stiffener 140 are right above corresponding support pins 126 on the top side of the substrate so as to define a space 150 in which the chip 110 and the bond wires 130 are situated.

In step 340, the molding compound 160, such as a molding epoxy, is injected into the central hole 144 of the stiffener 140. By injecting the molding compound into the space 150 through the hole 144, which is above the center of the space 150, wire sweeping due to the flow of molding compound is minimized. After the molding compound fills the space 150, it continues to flow to the topside 141 of the stiffener until the stiffener is covered and/or encapsulated in the molding compound. The molding compound 160 dries up quickly and forms a mold that holds the stiffener 140 in position and prevents the stiffener from being delaminated from the package.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An electronic package, comprising:
   a substrate;
   an electronic device mounted on a first side of the substrate;
   a stiffener having a hole at or near a center of the stiffener and disposed on the first side of the substrate, the stiffener and the substrate defining a space for housing the electronic device; and
   a molding compound filling the space and covering the stiffener wherein the substrate has support pins on the first side and the stiffener has ridges above respective support pins to define the space.

2. The electronic package of claim 1 wherein the stiffener is made of a material that has a relatively high thermal conductivity and that is mechanically robust to keep the package from warping during a thermal process.

3. The electronic package of claim 1 wherein the stiffener is made of metal.

4. The electronic package of claim 1 wherein the stiffener is made of copper.

5. The electronic package of claim 1 wherein the molding compound is a molding epoxy.

6. The electronic package of claim 1 wherein the thickness of the stiffener is about 0.5–2 mm.

7. The electronic package of claim 1 wherein the diameter of the hole of the stiffener is about 1–2 mm.

8. The electronic package of claim 1 wherein the size of the stiffener is about the same as the size of the substrate.

9. The electronic package of claim 1 wherein the molding compound covers the stiffener to a thickness greater than 0.1 mm.

10. A method of packaging an electronic device:
    bonding the electronic device on a first side of a substrate comprising:
    attaching a stiffener to the first side of the substrate, wherein the stiffener has a hole at or near a center of the stiffener, and wherein the stiffener and the substrate define a space for housing the electronic device; and
    injecting a molding compound into the hole of the stiffener, the molding compound filling the space and overflowing out the hole to cover the stiffener wherein the substrate has support pins on the first side and the stiffener has ridges, and wherein attaching the stiffener on the first side of the substrate further comprises attaching the ridges with respective support pins to define the space.

11. The method of claim 10 wherein injecting the molding compound further comprises injecting the molding compound into the hole of the stiffener until the molding compound fills the space and overflows out of the hold to cover the stiffener to a thickness greater than 0.1 mm.

12. The method of claim 10 wherein attaching the ridges with respective support pins further comprises
- dispensing an adhesive material in the support pins; and
- placing the stiffener on the substrate such that the ridges are in contact with the adhesive material on the support pins.

13. A method of packaging an electronic device:
bonding the electronic device on a first side of a substrate comprising:
- attaching a stiffener to the first side of the substrate, wherein the stiffener has a hole at or near a center of the stiffener, and wherein the stiffener and the substrate define a space for housing the electronic device; and
- injecting a molding compound into the hole of the stiffener, the molding compound filling the space and overflowing out the hole to cover the stiffener wherein the stiffener is among an array of stiffeners and the substrate is among an array of substrates, the array of substrates having guide pins and the array of stiffeners having guide holes to match the guide pins, and wherein attaching the stiffener to the substrate further comprises matching the guide holes with respective guide pins.

14. A method of packaging an electronic device, comprising:
- providing any array of substrates, the array of substrates including a substrate for the electronic device;
- providing any array of stiffeners, the array of stiffeners including a stiffener for the electronic device, the stiffener for the electronic device having a hole at or near a center of the stiffener;
- attaching the array of stiffeners to the array of substrates such that the stiffener and the substrate for the electronic device define a space for housing the electronic device; and
- injecting a molding compound into the hole of the stiffener, the molding compound filling the space and overflowing out of the hole to cover the stiffener wherein the substrate for the electronic device has support pins on the first side and the stiffener for the electronic device has ridges, and wherein attaching the array of stiffeners to the array of substrates further comprises attaching the ridges with respective support pins to define the space.

15. The method of claim 14 wherein injecting the molding compound further comprises injecting the molding compound into the hole of the stiffener until the molding compound fills the space and overflows out of the hole to cover the stiffener to a thickness greater than 0.1 mm.

16. The method of claim 14 wherein attaching the ridges with respective support pins further comprises
- dispensing an adhesive material on the support pins; and
- placing the array of stiffeners on the array of substrates such that the ridges are in contact with the adhesive material on the support pins.

17. A method of packaging an electronic device, comprising:
- providing any array of substrates, the array of substrates including a substrate for the electronic device;
- providing any array of stiffeners, the array of stiffeners including a stiffener for the electronic device, the stiffener for the electronic device having a hole at or near a center of the stiffener;
- attaching the array of stiffeners to the array of substrates such that the stiffener and the substrate for the electronic device define a space for housing the electronic device; and
- injecting a molding compound into the hole of the stiffener, the molding compound filling the space and overflowing out of the hole to cover the stiffener wherein the array of substrates has guide pins and the array of stiffeners has guide holes to match the guide pins, and wherein attaching the stiffener to the substrate further comprises matching the guide holes with respective guide pins.

* * * * *